United States Patent [19]

Li et al.

[11] Patent Number: 5,666,290
[45] Date of Patent: Sep. 9, 1997

[54] INTERACTIVE TIME-DRIVEN METHOD OF COMPONENT PLACEMENT THAT MORE DIRECTLY CONSTRAINS CRITICAL PATHS USING NET-BASED CONSTRAINTS

[75] Inventors: Ying-Meng Li; Sunil Ashtaputre, both of San Jose, Calif.

[73] Assignee: VLSI Technology, Inc., San Jose, Calif.

[21] Appl. No.: 579,381

[22] Filed: Dec. 27, 1995

[51] Int. Cl.[6] ............................................ G06F 17/50
[52] U.S. Cl. ........................ 364/491; 364/489; 364/490
[58] Field of Search ............................ 364/488, 489, 364/490, 491

[56] References Cited

U.S. PATENT DOCUMENTS

| | | | |
|---|---|---|---|
| 5,113,352 | 5/1992 | Finnerty | 364/490 |
| 5,218,551 | 6/1993 | Agrawal et al. | 364/491 |
| 5,237,514 | 8/1993 | Curtin | 364/490 |
| 5,367,469 | 11/1994 | Hartoog | 364/491 |
| 5,397,749 | 3/1995 | Igarashi | 437/250 |
| 5,402,357 | 3/1995 | Schaefer et al. | 364/490 |
| 5,461,576 | 10/1995 | Tsay et al. | 364/490 |
| 5,475,607 | 12/1995 | Apte et al. | 364/489 |
| 5,513,124 | 4/1996 | Trimberger et al. | 364/491 |
| 5,521,837 | 5/1996 | Frankle et al. | 364/491 |
| 5,544,071 | 8/1996 | Keren et al. | 364/489 |

OTHER PUBLICATIONS

Teig et al., "Timing–Driven Layout of Cell–Based Ics," 1986 VLSI Systems Design, pp. 63, 64, 68, 70, 72 73.
Youssef et al., "Critical Path Issue in VLSI Design," 1989 Int'l CAD Conference, pp. 520–523.
Dunlop et al., "Chip Layout Optimization Using Critical Path Weighting," 1984 21st Design Automation Conference, pp. 133–136.
Fiduccia et al., "A Linear–Time Heuristic for Improving Network Patitions," 1982 19th Design Automation Conference, pp. 175–181.
Srinivasan et al., "RITUAL: A Performance–Driven Placement Algorithm," 1992 IEEE Trans on Circuits & Systems, pp. 825–840.

*Primary Examiner*—Kevin J. Teska
*Assistant Examiner*—Leigh Marie Garbowski
*Attorney, Agent, or Firm*—Irell & Manella LLP

[57] ABSTRACT

A method of optimizing the placement of components of an integrated circuit to ensure that all circuit paths will meet their timing criteria, as well as to minimize area and total wire length is disclosed. The method employs a non-constant net weighting distribution along critical paths to encourage a mincut algorithm to place components so that path lengths are minimized as well as the entire nets coupled to paths. The magnitude of weights assigned are commensurate with the slack the path has with respect to its maximum delay constraint, as well as the level of method iteration. Any nets not deemed critical are assigned a minimum capacitance constraint to prevent them from becoming critical as a function of actual placement. Weights assigned to capacitively constrained nets are inversely proportional to the difference between the maximum capacitance allowed and the estimated capacitance of the current placement. A novel manner of estimating the propagation delay along the interconnect of the critical path is implemented. A novel weighting of driver/buffer pairs ensure that the most sensitive nets of the pairs are kept short.

22 Claims, 10 Drawing Sheets

INTERACTIVE TIME-DRIVEN METHOD OF COMPONENT PLACEMENT THAT MORE DIRECTLY CONSTRAINS CRITICAL PATHS USING NET-BASED CONSTRAINTS

BACKGROUND OF THE INVENTION

1. Field of the Invention:

The present invention relates to the computer-aided design of integrated circuits, and more particularly to the automated optimization of component placement to ensure that timing constraints on all paths in such circuits can be met upon routing of the interconnections between the placed components.

2. Background of the Related Art:

Integrated circuit processing technology presently permits the creation of monolithic integrated circuits that involve millions of transistors. Due to the sheer number of devices on a single chip, an entire industry has evolved specifically to supply the semiconductor industry with software and hardware tools with which to automate much of the integrated circuit design process. In particular, significant research and development effort has been directed to effecting optimal placement of each component on the chip not only to minimize die area, but also to meet critical timing requirements of the various signal paths established through routing of the interconnect between the various components of the circuit.

A signal path of a circuit typically comprises a series of components as well as the segments of interconnect by which a signal travels from the output drivers of one of the series of components to the input of another. Critical paths are typically those which present relatively little headroom (also known as slack) for increases in path delay due to parasitics introduced by the segments of interconnect. As the feature sizes of components have continued to shrink over the past decade, the intrinsic delay through these devices has decreased commensurately. As a result, delays resulting from the parasitic loads presented to these components have become the predominate constituent of signal propagation delay through the paths of such circuits.

Thus, whether a critical path meets its timing constraint can be greatly affected by the length of interconnect segments that directly couple the components comprising the critical path, as well as the total length of the interconnect that couples each of the path segments to the inputs of other components of the circuit. The relative placement of the components of the circuit prior to interconnect routing therefore directly impacts the contribution of interconnect parasitics to the total delay experienced by a signal as it propagates through a path.

The process of automated chip design generally begins with a description of the desired chip function in VHDL (Verilog Hardware Description language) or a similar language. This functional description of the circuit is used to simulate the desired operation. Once verified, the functional description is input into a synthesis tool which extracts, from the description, hardware components and the interconnections requisite to implement the described functionality. The synthesis tool outputs the extracted physical representation of the circuit in the form of a netlist, which lists the components and their respective interconnections. The components can be individual circuit elements such as transistors, or they can be more complex cells or modules which comprise a number of circuit elements which are already themselves optimally placed and connected to perform standard functions. A "place-and-route" tool is then typically used to physically place the components defined by the netlist in two-dimensional space and then routes the conductive interconnections (i.e. nets) between each component's output and the input pins of other components as defined by the netlist. A net comprises one or more branches of interconnect, each branch connecting the output pin of one component to an input pin of another component. A circuit path is comprised of a series of segments, each segment encompassing a component and the interconnect branch which couples it to the input of the next component in the path.

During functional simulation of the integrated circuit design, a number of paths can be first identified as time critical. For example, an output signal of a first component might be required to propagate through a particular path of components and be available at the input of another component prior to arrival of, for example, a clock signal. In addition, synchronous clock signals that are supposed to arrive at inputs of numerous components throughout a circuit simultaneously may become skewed in time based on unequal propagation delays caused by varying interconnect lengths. Thus, in either case there is a maximum amount of time by which these signals can be delayed through a path such that the circuit will still operate properly. A critical path is typically one which has a relatively small margin for additional delay introduced by the parasitics of its interconnect. Of course, paths which are not be considered critical prior to component placement might become so if too much attention is paid to optimizing the most critical paths. A method for identifying critical paths is disclosed in "Critical Path Issues in VLSI Designs," H. Youssef et. al., *IEEE International Conference on Computer-Aided Design*, 1989, P. 520, which is incorporated herein by this reference.

There are a number of constituents which add up to the delay $D_P$ experienced by a signal propagating through a path. First, there is the intrinsic delay $D_i$ presented by each circuit component in the path through which a signal is transmitted. $D_i$ is the time necessary for the signal to propagate through the component (i.e. input to output) with no load.

A second constituent of $D_P$ is the delay experienced by the output driver of each component in the path in driving the capacitive load presented to it. The load presented to each driver of a path includes the total input capacitance $C_{in}$, which is the sum of the input capacitances of all of the components to which it is coupled through its net, and the capacitance $C_W$ of the physical interconnect comprising its net. The ability of the driver of each component to drive its load, $C_{in}+C_W$, is called its effective resistance S, which when multiplied by the sum of $C_{in}$ and $C_W$ equals the delay incurred in driving those capacitances.

A third constituent of $D_P$ is the delay $D_{RC}$ experienced by the signal in propagating along the branch of interconnect between the output pin of the component of each segment of the path and the input pin of the component of the next segment. Thus, the equation defining the total delay $D_S$ experienced by a signal through each segment of a path in a circuit is $D_S = D_i + S \cdot (C_{in} + C_W) + D_{RC}$. The total delay through the path $D_P$ is then simply the sum of the segment delays for the path.

The intrinsic delay of the component $D_i$, the total input capacitance of the inputs of the components driven by the output of the component $C_{in}$, and the effective resistance of the component's driver S are constituents governed by circuit design considerations which are considered during the synthesis or generation of the netlist and do not vary as a function of interconnect length. The components identified in the netlist are selected from cell libraries or designed in contemplation of such characteristics. Because die area minimization is always a consideration, and given that a driver's effective output resistance S is inversely proportional to its size, it will not usually be desirable to select components which have substantially less effective resistance S than is necessary to meet the timing constraints. Thus, it is important to minimize the amount of interconnect length, particularly the length of the interconnect coupled into critical paths, to minimize those increasingly more dominant components of the path delay $D_P$ which are affected by wire length, namely $S \cdot C_W$ and $D_{RC}$.

The first placement techniques were net-based in character. Net-based techniques do not deal directly with the paths of a circuit, but rather act on the circuit nets each of which are typically coupled into multiple paths. The first net-based placement techniques simply attempted to minimize the total wire length of all of the nets in the circuit. A number of these techniques are based on a minimization algorithm known as the "mincut method." The mincut method iteratively cuts the chip into smaller and smaller equal sections using a cut-line. The method attempts to place the components on either side of the cut-line to minimize the number of nets or net segments which cross the cut-line. An area constraint is placed on the algorithm so that it splits the total area divided by the cut-line roughly in half and this proportion is maintained between the two sections during minimization. An example of a mincut method is disclosed in "A Linear-Time Heuristic for Improving Network Partitions," C. M. Fiduccia and R. M. Mattheyses, Paper 13.1, 19th Design Automation Conference, IEEE, 1982, and which is incorporated herein by this reference.

While an approach that simply reduces overall net length may reach a placement solution which minimizes die area and reduces overall parasitic capacitance due to interconnect, it cannot by itself ensure that timing constraints on specific paths will be properly met. Thus, attempts have been made to adapt net-based techniques to take account of critical paths in the circuit; put another way, to make them timing-driven. One simple technique places a maximum permissible capacitance on nets which are coupled to critical paths to prevent them from exceeding their timing constraints. A more sophisticated technique imposes a cost-weighting function to the nets coupled to identified critical paths, the weights being used to bias place and route tools into minimizing those nets at the expense of nets not coupled into critical paths. Typically, the critical paths are identified prior to layout and weights are assigned to the nets coupled to those nets based on an assessment of how much headroom (e.g. slack) is present for each critical path (i.e. the difference between the maximum permissible path delay and an initial estimate of the path delay taking interconnect into account).

The above-described weighting technique permits the initial path delay to be based on some arbitrary estimate of the interconnect for the nets coupled to the path, or on path delays calculated for each critical path based on an actual initial placement. The weights are used to bias priorities associated with placement and routing tools. The circuit is then simulated based on the resulting layout and if critical timing requirements have not been met, the layout is adjusted and resimulated until the constraints are met. An example of this technique is disclosed in "Chip Layout Optimization Using Critical Path Weighting," A. E. Dunlop, et al., Paper 9-2, ACM/IEEE 21st Design Automation Conference, 1984, the text of which is incorporated herein by this reference.

While the foregoing timing-driven weighting techniques skew the minimization of net lengths (and thus net capacitance) in favor of those nets coupled into critical paths, they neither check placement during the layout process to determine whether critical path timing constraints are being met, nor do they update the weighting in accordance with the changing layout producing varying interconnect lengths defined by each placement iteration. As iterations of placement occur, the actual length of any given net can vary such that paths that were considered critical at the start of the placement process may have become less so, whereas other paths originally thought non-critical may have become critical.

A further refinement of this net-weighting technique calculates path delays after each placement iteration for those paths having been initially identified as critical. This technique employs a constraint engine by which the timing constraint of each critical path is converted to a net weight that is assigned to each of the nets coupled into that path, the magnitude of the weight being commensurate with how critical the path is (i.e. how little slack the path has). Iterative net-weighting techniques typically employ a variation of the mincut algorithm such that the total weight of all nets or segments of nets crossing the cut-line is minimized by moving the components from one side of the cut-line to the other. After each iteration of the mincut algorithm, the constraint engine recalculates the path delays and the slack for the critical paths based on the new placement resulting from the previous iteration and reassigns new net weights based on the current slack value for each critical path.

Because of the time-consuming calculations which must be made by the constraint engine and the mincut algorithm, it is not practicable to constrain and update all nets in a circuit in the above-described manner. Thus, some paths which are deemed not critical initially may become critical once nets coupled to them are sacrificed in length for others deemed more critical. Further, because the nets coupled to a critical path are assigned the same weight, components in a path which is bisected by the cut-line will not necessarily be moved to the same side of the cut-line because such moves will not provide a gain to the minimization algorithm. Thus, the algorithm must rely on hill-climbing techniques to avoid local minima which are encountered along paths. It is well-known that hill-climbing techniques, which make a series of moves that either provide zero or even negative gain to discover larger gains, are not guaranteed to discover the benefits of shortening the paths themselves. Thus, $D_{RC}$ and $S \cdot C_W$ are not guaranteed to be minimized.

The shortcoming of all of the foregoing net-based techniques is that they place constraints on nets even though it is the paths of the circuit that have critical timing requirements. Thus, the path delays are only indirectly affected by the minimization of the nets which are coupled to the paths. The minimization of net capacitance driven by elements in a critical path is only one of the constituents of the load which is driven by the element; the other constituent is the delay experienced by the signal as it travels the path segment between the ouput of one element in the path and the input of the next element in the path. These techniques therefore do not minimize the $D_{RC}$ component of each segment $D_S$.

A second class of timing-driven placement methods has evolved that determine component placement based directly on calculations of path delay for each of the critical paths. Thus, the interconnect coupled into a critical path, including the segments of nets coupling the components of the path, is directly constrained based on delay calculations for the path rather than indirectly through weighted minimization of nets coupled into the path. The critical paths are guaranteed to meet their timing constraints if at all possible. Those critical paths which are currently meeting their timing constraints are optimized for wire length and area, while those paths which are not meeting their constraints are optimized for delay at the expense of other areas of the circuit if necessary. These path-based techniques, like mincut minimizations, often break the circuit into sub-areas. They then analyze the delay through individual path segments, making the coordinate location of the various components a complex mathematical function of the parameters defining path delay. These path-based techniques, while able to constrain paths directly rather than indirectly by constraining the nets coupled into the path, are extremely computation intensive and thus time consuming. As a result they are typically restricted to a relatively small number of critical paths. Otherwise, they would risk not reaching a solution within a reasonable period of time. As with net-based techniques, some paths may become critical which were not originally deemed critical because they are not being constrained. Examples of timing-driven path-based placement techniques are disclosed in Ritual: A Performance Driven Placement Algorithm, by Arvind Srinivasan, Kamal Chaudhary, and E. S. Kurth, Memorandum No. UCB/ERL M91/103, Nov. 19, 1991; and W. E. Donath, et at., "Timing Driven Placement Using Complete Path Delays," 27th ACM/IEEE Design Automation Conference, 1990, pp. 84–89.

Because layout is primarily concerned with routing nets rather than paths, it is it is more efficacious to use net-based constraints on placement. Because critical timing problems are path-based, however, direct constraints on placement must somehow be imposed based on path delay. Therefore, there is room in the art for a placement methodology that imposes a direct influence on path delays during placement using net-based constraints, which does not permit paths which are not critical to become critical at the expense of those paths initially identified as critical, and is capable of reaching a solution within a reasonable period of time.

SUMMARY OF THE INVENTION

The present invention provides a method of optimizing the automated placement of components comprising an integrated circuit that enhances existing net-based techniques to impose constraints on placement which directly constrain the critical paths of a circuit based on path-based timing constraints. The present invention does so while ensuring that noncritical paths do not become critical during the placement process and without undue complexity and/or computation time. The present invention achieves these results by employing a constraint engine that generates net weights for those nets coupled into critical paths, the net weights having a distribution wherein the weight decreases with respect to the center of the critical path. Moreover, the net weight values vary depending upon the degree to which each path is critical, as well as the current level of placement iteration. The remaining nets coupled to noncritical paths are constrained by default net weights, constant net weights specified by the user, and/or net weights derived from a maximum capacitance (MAXCAP) value assigned by the user.

The net weights are then fed to a modified min-cut algorithm that attempts to minimize the weight of all net segments crossing the cut line. The convex distribution of the net weight values ensures that there will be a benefit perceived by the min-cut algorithm in shortening the net segments of the path. Thus, the delay $D_{RC}$ associated with the propagation of the signal along the specific net segments of the path will be minimized as well as the overall length of each net as a whole. After each placement iteration, the path delays are recalculated for the critical paths based on the current placement and new constraints are generated by the constraint engine in accordance with the slack each critical path currently has. Net weights are also generated for nets constrained by MAXCAP values. The weight values are inversely proportional to the difference between the capacitance of the net estimated from the current placement and the net's MAXCAP value. Thus, placements are discouraged that permit a noncritical path to exceed its MAXCAP value and thereby become critical.

The method of the present invention takes a netlist description of a VSLI circuit as its input and generates an initial placement of the circuit components based on constraints identified during the simulation process and/or defined by the user. The constraints used during the initial placement preferably include maximum capacitance $C_{MAX}$ on some or all of the nets as determined through simulations or experience, any fixed constraints (i.e. constant net weight values) desired by the user, and any constraints on area, all to be specified by the user. Any nets not otherwise constrained are assigned a default net weight value of 1. The initial placement employs well-known mincut techniques to minimize overall wire length of the nets of the circuit.

After the initial placement step, delays are calculated for each path identified as critical based on the routing required by the initial placement. An approximate Steiner Tree Model is used to estimate interconnect lengths for each net coupled to the critical paths. The path delay is calculated by determining the sum of the delays $D_S$ through each segment of the path. A segment typically includes one of the components of the circuit and the net which couples an output of the component to one or more inputs of components. Of course, the last segment may only drive a band pad which can be which can be coupled to external circuitry. Additionally, critical paths may be series of segments which do not begin with an input of the chip and end with an output of the chip.

The delay for each segment is calculated as $D_S = D_i + S \cdot C_{in} + S \cdot C_W + D_{RC}$, where $D_i$ is the intrinsic delay of the component between its input which is in the critical path to its output which is in the critical path, S is the effective resistance of the component, $C_{in}$ is the total capacitance of all inputs to which the net of the segment is coupled, $C_W$ is the total capacitance of the net of the segment and $D_{RC}$ is the propagation delay of a signal along the branch of the net of the segment which couples the output of the component of the segment to the input of the component of the next segment of the critical path. The total path delay $D_P$ is the sum of the delays $D_S$ for each segment of the critical path. The slack (i.e. the amount of wire delay which can be tolerated before the path constraint is no longer met) is calculated for each critical path. Slack is defined as the difference between the upper constraint on the path delay $D_C$, and the sum of the intrinsic delay $D_i$ of the component of each segment and the driver response delay for each segment due to the sum of the input capacitances $C_{in}$. Thus for a given path, $SLACK = D_C - D_I$, where $D_I$ is equal to the sum of all delay constituents for each segment of the path (i.e. $D_i + S \cdot C_{in}$) intrinsic to the component of the segment. Put another way, $D_I$ is the sum of the delay constituents which are fixed by the component designs.

Once the slack has been calculated for the critical paths, term-weights $W_T$ are calculated by the constraint engine for each critical path as follows: If $D_L > SLACK/2$, where DL is equal to the sum of all delay constituents for each segment of the path (i.e. $S \cdot C_W + D_{RC}$) due to interconnect, the preferred embodiment of the method of the invention assumes that the path constraint has been violated. In this case, the term weight $W_T=(\max[D_L-SLACK/2; 5])\cdot(\max[10-i_L; 1])$. If $D_L \leq SLACK/2$, then $W_T=1$. Thus, if the delay along the path due to interconnect $D_L$ exceeds half of the slack, $W_T$ is determined by multiplying the maximum of two values, either the amount by which $D_L$ exceeds one half of the slack or 5, by the maximum of two other numbers, either the difference between 10 and the mincut iteration level ($i_L$), or 1.

The value of $W_T$ for each path is directly proportional to the amount by which $D_L$ exceeds one half of the slack, and the iteration level $i_L$ of the mincut minimization algorithm. The term-weight $W_T$ is then used as a basis for determining a non-constant distribution of net weight values which are assigned to the nets coupled into the critical path. The distribution increases towards, and peaks at, the middle of the path. The net coupled to the centermost segment of the path is assigned a mid-weight which is some function of $W_T$. In one embodiment, the pair of outside nets coupled to each end of the critical path are assigned the value of $W_T$, and the mid-weight is defined as $2W_T$. Each pair of nets of segments of the path moving towards the center segment are assigned a weight equal to W+i·Step for i=0 to n, where Step=W/n, and where n=the total number of pairs of nets from the end of the path to the middle of the path (not counting the middle net). In another embodiment, the distribution of net weight values along each critical path is convex in character.

For those critical paths having slack which equals or exceeds two times the initial interconnect delay (i.e. $SLACK \geq 2(D_L)$, the weight W assigned to each net coupled into the segments of that path is set equal to 1. For all nets not coupled into critical paths, a maximum capacitance (MAXCAP) can be established for those nets. A net weight is generated for all paths so constrained based on the difference between the current capacitance of the net (proportional to net length) and the maximum capacitance for that net. The less the difference, the greater the assigned net weight and vice versa. MAXCAP serves to constrain those paths initially considered non-critical such that they will not eventually become critical or hypercritical during optimization of the critical paths. If a net has been assigned more than one net weight value W because it is coupled into more than one path, or because it was initially constrained by a maximum capacitance or a user specified weight value, the net always retains its maximum currently assigned value as its weight (i.e. $W=\max[W_1, W_2 \ldots W_n]$).

Once the initial constraints have been calculated and assigned, the method of the present invention calls its mincut minimization algorithm which splits the available area in half plus or minus some tolerance (i.e. iteration level ($i_L$)=0) and attempts to minimize the total weight of any interconnect lines intersecting the cutline by moving components to one side or the other of the cutline. Non-constant weighting of the nets along a critical path with a peak value in the middle encourages the movement of components in the path to the same side of a cutline, thereby reducing the length of the interconnect segments directly coupling the components of the path. Reducing the path length directly reduces $D_{RC}$. The non-constant weighting also tends to reduce the overall length of the nets coupled into the critical path, thereby leading to a reduction in $C_W$ for those nets.

Once the minimization algorithm converges to a stable solution for the current cutline at the current level of iteration, a new set of coordinates for the components of the circuit, produced by the minimization algorithm, are fed into a placement engine which updates the placement of the components. The updated or current placement is then input to the constraint engine which derives new path delays for all critical paths based on the current placement. The engine recalculates slack and then net weights in accordance with the delay calculations derived from the current placement. The entire process is repeated for each cutline at each level of iteration with a new placement resulting from each cycle. Each level of iteration divides the chip area into smaller regions of roughly equal area, with each level of iteration $i_L$ comprising $2^n$ cut-lines (where n=iteration level starting with n=0 at the top level). The method of the invention continues to divide the chip into smaller regions until a satisfactory placement is achieved or until each region created by the mincut algorithm contains only one of the circuit components or modules listed in the netlist. The optimal number of iteration levels for a circuit placement will depend upon factors such as the initial size of the circuit.

The step of calculating the path delay for each critical path can further include a unique process of approximating $D_{RC}$ for each segment of the critical path;

$$D_{RC} = rD\frac{(L)}{(D+L)}(C_w + C_{in})$$

where r=unit length resistance of the interconnect, D=distance between the branch start-point and end-point (i.e., the output of the component of the segment to the input of the component of the next segment), L=total wire length of the net coupled to the output of the component of the segment, $C_W$=total wire capacitance presented to the output of the component of the segment by the net of the net segment and $C_{in}$=the sum of all input capacitance coupled to the output of the component of the segment via the net of the segment. L can be approximated using a known bounding box technique and D can be approximated as the rectilinear distance between the start-point and the end-point of the branch of the net of the segment coupling the output of the component of the segment to the input of the component of the next segment.

Finally, the method of the invention can also include a step whereby components of the circuit to be placed can be identified which are intended to step up or buffer the drive capability of another component which is driving the buffering component. Because the buffering component has significantly lower effective resistance S and thus a higher drive capability, it can tolerate increases in the length of the nets it drives much more easily than the component it is buffering. Thus, the method of the present invention automatically identifies the driver/buffer pairs and assigns a much higher weight to the net by which the driver circuit is coupled to the buffer relative to the net driven by the buffer. This weighting constraint will tend to minimize the length of the net (and especially the branch of the net) coupling the buffered circuit to the buffer, thereby skewing wire length increases to the nets driven by the buffer which can more easily tolerate the increase in load than can the buffered driver circuit.

BRIEF DESCRIPTION OF THE DRAWINGS

FIG. 7b illustrates the distribution of non-constant net weight values for the preferred embodiment of the non-constant weighting scheme of the present invention as shown in FIG. 7a.

DETAILED DESCRIPTION OF THE INVENTION

Figure 1:
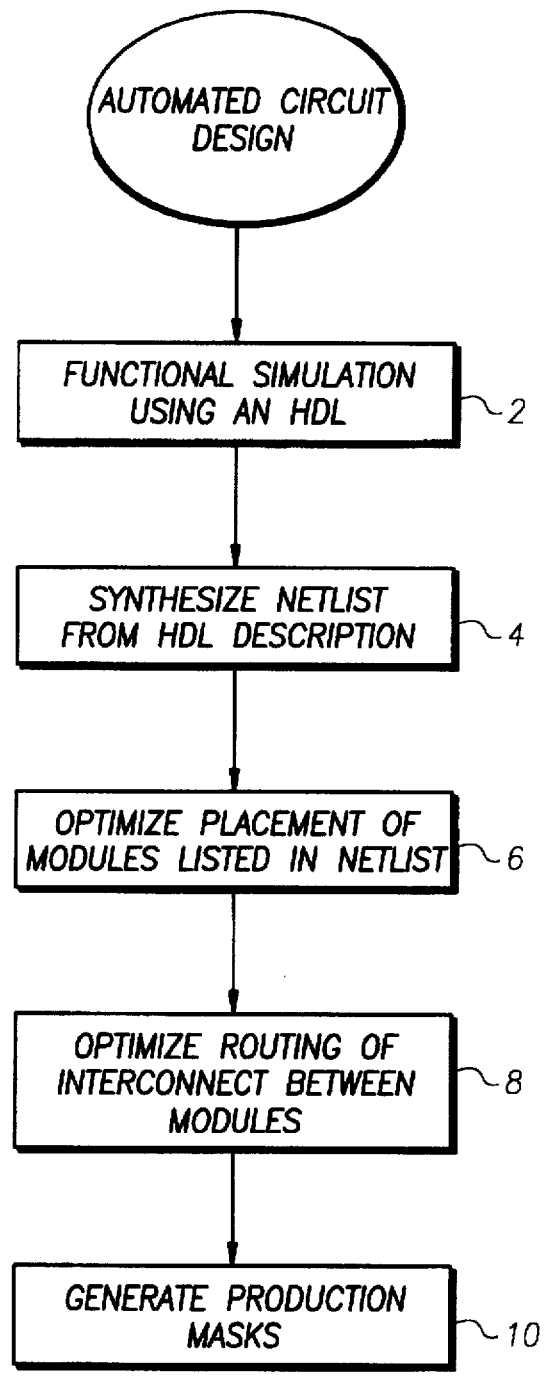
FIG. 1 illustrates a typical procedural flow for the automated design of VLSI circuits.

FIG. 1 illustrates the high level flow diagram already known in the art for automatically designing a VLSI integrated circuit. The first step, represented by functional block 2, involves the functional simulation of the circuit to be designed using a hardware description language (HDL). The next step, represented by functional block 4, involves the synthesis of a netlist representation of the integrated circuit from the HDL description. The next step, depicted by functional block 6, involves the placement of modules or components of the integrated circuit to facilitate routing of the nets of the circuit as they are defined in the netlist. It is desirable to place the modules or components of the circuit such that when detailed routing of interconnections between the components is complete, area constraints have been met, overall wire length has been minimized wherever possible and most importantly, all of the paths within the integrated circuit meet their timing constraints. The next step, represented by functional block 8, involves the completion of global and detailed routing of the circuit nets between the placed components. The last step, represented by functional block 10, involves the generation of production circuit masks from the digitized layout of the integrated circuit. It is the placement step in the automated design process as represented by functional block 6, to which the method of the present invention is primarily directed.

Figure 2:
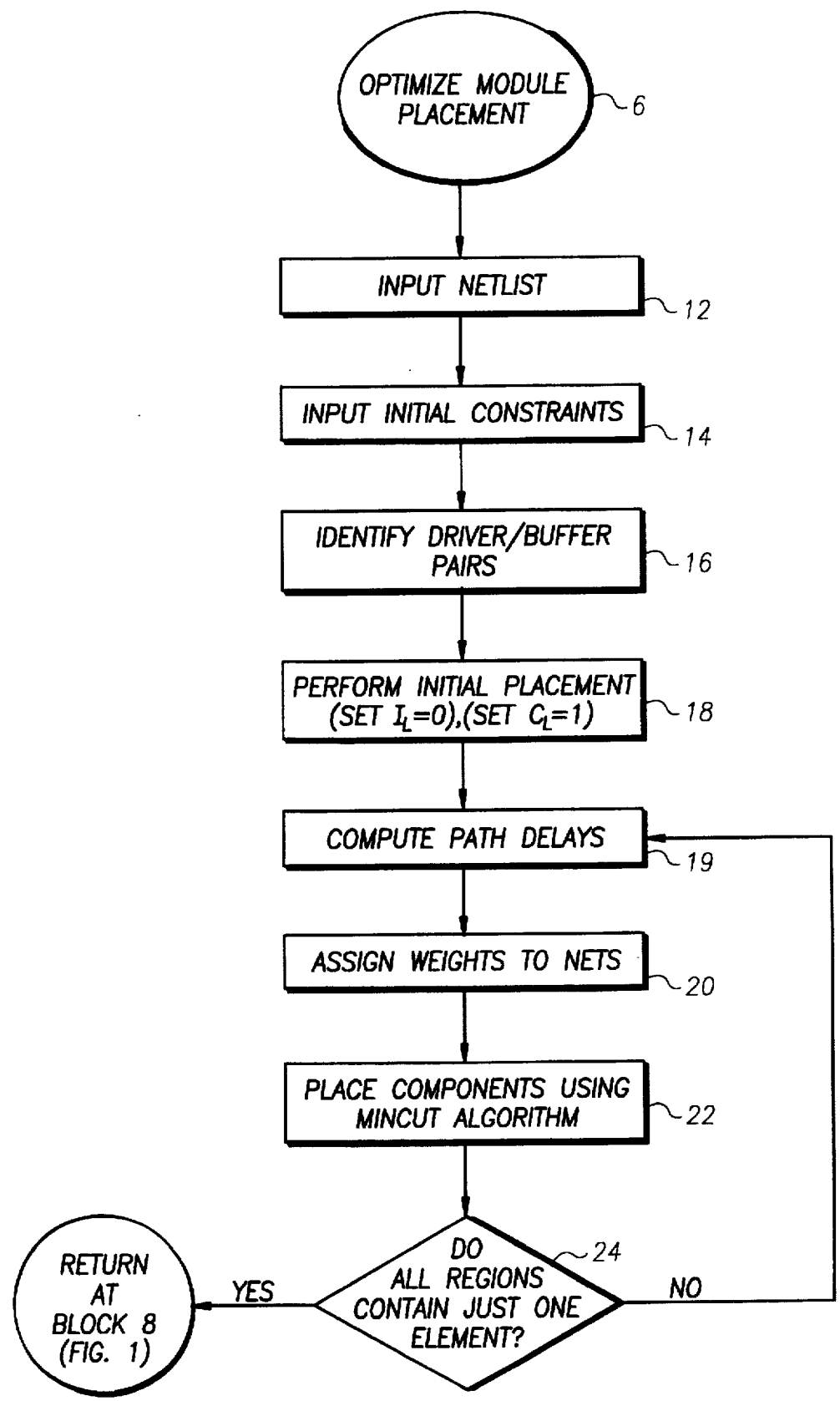
FIG. 2 illustrates the procedural flow of a preferred embodiment of the placement process of the present invention.

FIG. 2 illustrates a high level flow diagram describing the steps performed by the method of the present invention to optimize module or component placement. The first step in the process is to receive the netlist description of the circuit for which the components are to be optimally placed. This is represented by functional block 12. The next step involves the input of initial constraints by the user if any. Initial constraints are typically fixed constraints on individual nets of the circuit which are imposed by the user prior to initiating the placement process. These initial constraints can take the form of MAXCAP values which are preferably associated with those nets which are coupled to non-critical paths in the circuit. The MAXCAP values serve as back-stop constraints to ensure that paths which have been initially deemed non-critical, do not become critical because they have been ignored. Other nets may be constrained with very high weighting values if they are coupled into paths that are so critical that the user wishes these nets to be minimized on a high priority basis.

Figure 10:
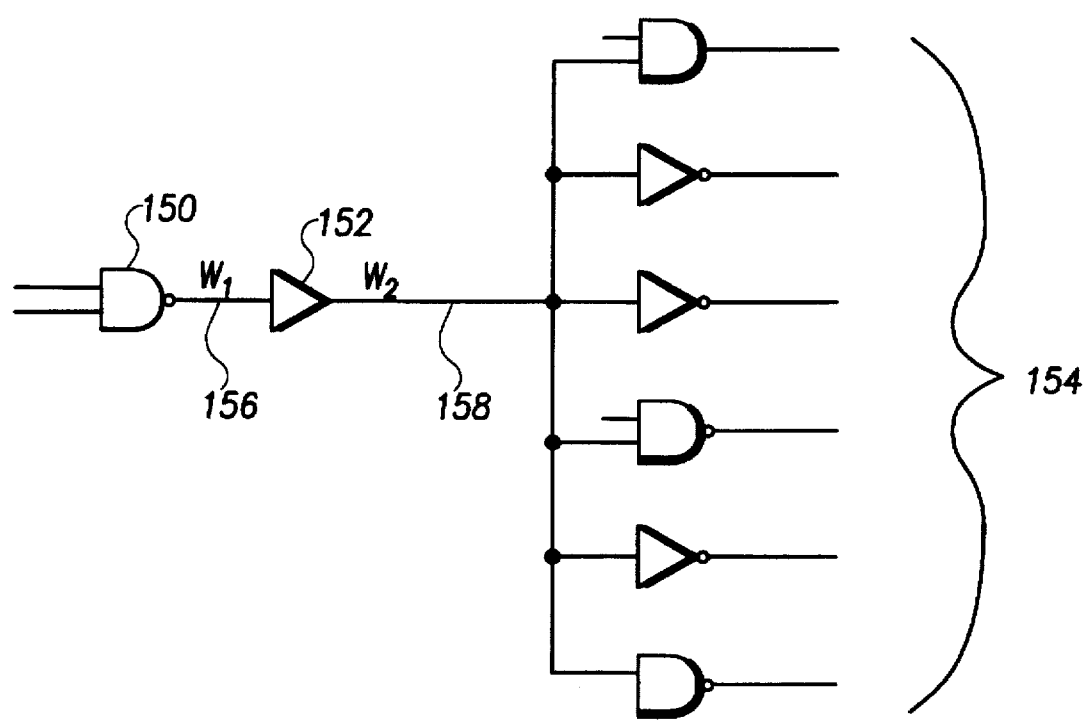
FIG. 10 illustrates the weighting of driver buffer pairs by the method of the present invention.

The next step, represented by functional block 16, involves the identification of driver/buffer pairs. The method of the invention searches the netlist to identify those driver circuits which have been paired with a buffer circuit in order to drive a large capacitive load such as a large number of circuit inputs. Such a combination is illustrated in FIG. 10. Circuit 150 does not have sufficient drive capability to drive the extremely large number of input pins presented by components 154. Thus, buffer 152 is inserted which is specifically designed to have a very low effective resistance S and therefore very high low driving capability. The fact that buffer 152 has a very low effective resistance means that the delay caused by increases in the length of interconnect 158 will be relatively minimal. On the other hand, changes in the length of net 156 will create much larger delay effects because component 150 has a relatively higher effective resistance.

The method of the present invention searches the netlist and identifies combinations such as that of driver 150 and buffer 152, and imposes fixed weight constraints on nets 158 and 156 such that $W_1$ will be very large compared to $W_2$. Thus, the placement process will tend to keep driver circuit 150 and buffer circuit 152 very close together thereby minimizing the delay caused by the parasitic of net 156, while permitting the placement process to relax the constraints on net 158 relative to net 156.

The next step of the method of the invention is to perform an initial placement. This step is represented by functional block 18 of FIG. 2. Those of skill in the art will understand that the initial placement can be based on any number of criteria, including desired chip dimensions, the initial constraints specified by the user, estimated path delays and total wire length. In the preferred embodiment of the present invention, initial placement step 18 calls the mincut algorithm and performs a placement based entirely on overall wire length minimization within a given area constraint. The overall wire length minimization process can be influenced by MAXCAP and any initial constraints on nets imposed by the user in step 14. Moreover, the initial placement step can be performed repeatedly until the procedure converges to a best initial placement. Upon completion of the initial placement step, the mincut iteration level $i_L$ is set equal to zero and the cut level $c_L$ is set equal to one.

The process then computes path delays for all identified critical paths based on the initial placement reached by step 18. Those who are skilled in the art will recognize that there are a number of ways in which critical paths can be identified prior to the compute path delay step 19. Once identified, a maximum delay constraint $D_c$ is then associated with each critical path which should not be exceeded. The preferred embodiment of the present invention computes path delay for each critical path by first estimating the lengths of the nets which are coupled to the critical path as a function of the current placement of the components or modules. Those skilled in the art will recognize that there are a number of ways by which the net branches can be estimated, including the well-known Steiner Tree Model. The preferred embodiment of the present invention employs an approximation of the Steiner Tree Model.

Once the overall length of the nets coupled to a segment has been estimated, the delay through each critical path is calculated by summing the delays for the individual segments making up each critical path. The delay for each segment $D_s=D_i+S \cdot C_{in}+S \cdot C_W+D_{RC}$, where $D_i$ is the intrinsic delay of the component between its input which is in the critical path to its output which is in the critical path, S is the effective resistance of the component, $C_{in}$ is the total capacitance of all inputs to which the net of the segment is coupled, $C_W$ is the total capacitance of the net of the segment and $D_{RC}$ is the propagation delay of a signal along the branch of the net of the segment which couples the output of the component of the segment to the input of the component of the next segment of the critical path. The value $C_W$ is based on the unit length capacitance for the material which comprises the nets. These materials will depend upon which layer of the integrated circuit will be used for the various interconnect branches of the net of the segment.

The value for $D_{RC}$ can be estimated from the following equation:

$$D_{RC} = rD\frac{(L)}{(D+L)}(C_w+C_{in})$$

where r=unit length resistance of the interconnect, D=distance between the branch start-point and end-point (i.e., the output of the component of the segment to the input of the component of the next segment), L=total wire length of the net coupled to the output of the component of the segment, $C_W$=total wire capacitance presented to the output of the component of the segment by the net of the net segment and $C_{in}$=the sum of all input capacitance coupled to the output of the component of the segment via the net of the segment. L can be approximated using a known bounding box technique and D can be approximated as the rectilinear distance between the start-point and the end-point of the branch of the net of the segment coupling the output of the component of the segment to the input of the component of the next segment.

Figure 9:
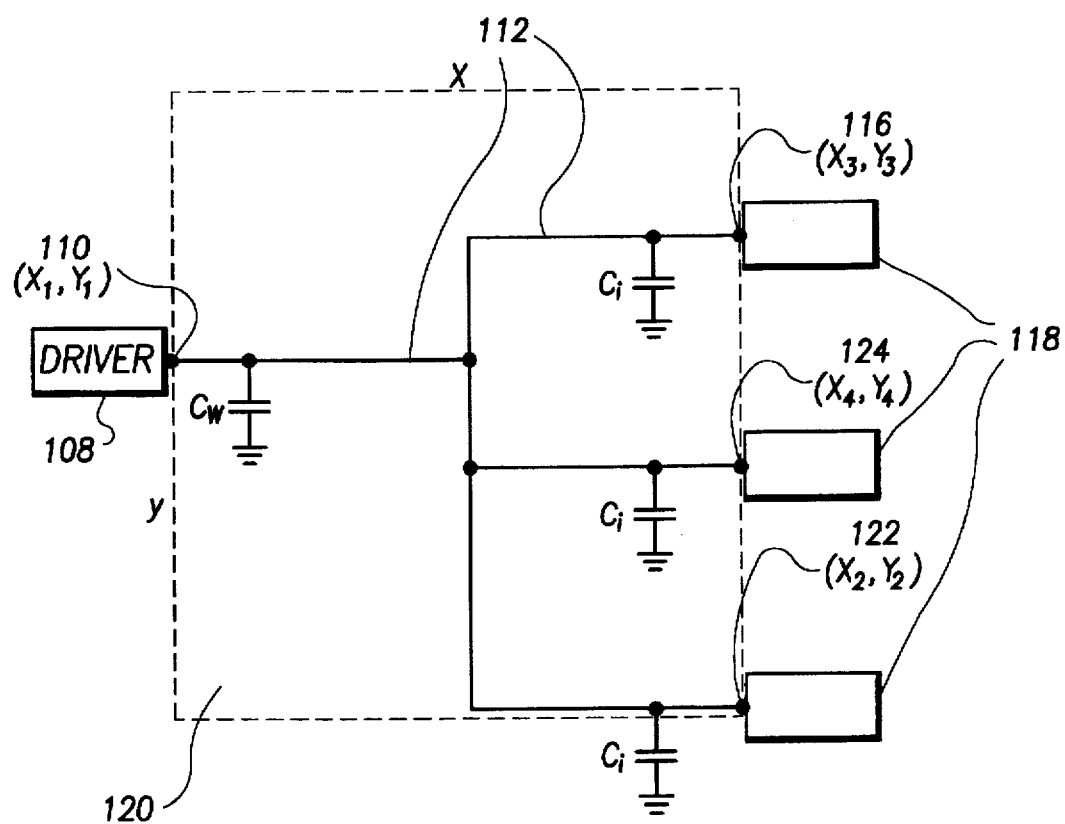
FIG. 9 illustrates the preferred process of estimating $D_{RC}$ by the present invention.

FIG. 9 illustrates an example of how the above defined equation can be used to estimate $D_{RC}$ for a segment of a critical path. Regardless of whether the branch of the net of the critical path segment is between driver pin 108 and input pin 116, input pin 124, or input pin 122, the total wire length of the net 112 coupled to the critical path segment can be calculated by drawing bounding box 120 such that it bounds the coordinates of pins 116, 124, 122, and 110. The total wire length L of the net can be estimated by adding the dimension x to the dimension y such that L=x+y. This estimate is more than adequate because one cannot know the precise routing configuration that will ultimately result between the placed components 108 and 118 until after the detailed routing step of the design process has been completed. Thus, although a prior art technique such as Elmore Delay could be used to determine a precise length for each branch of the net 112, such a technique presumes that one already knows the detailed routing configuration of net 112. If the critical path segment of interest includes the branch of net 112 between driver pin 108 and input pin 116, for example (i.e., because component 108a is part of the next segment of the critical path) the total wire length between those two points D can be calculated as the rectilinear distance between the coordinates of those two points, i.e. $|X_3-X_1|+|Y_3-Y_1|$.

The interconnect delay constituents for each segment of a critical path are then summed and added to those delay constituents which are intrinsic to the components of each segment within the critical path to calculate the overall current delay for the critical path $D_P$. This process is repeated for each identified critical path.

Figure 3:
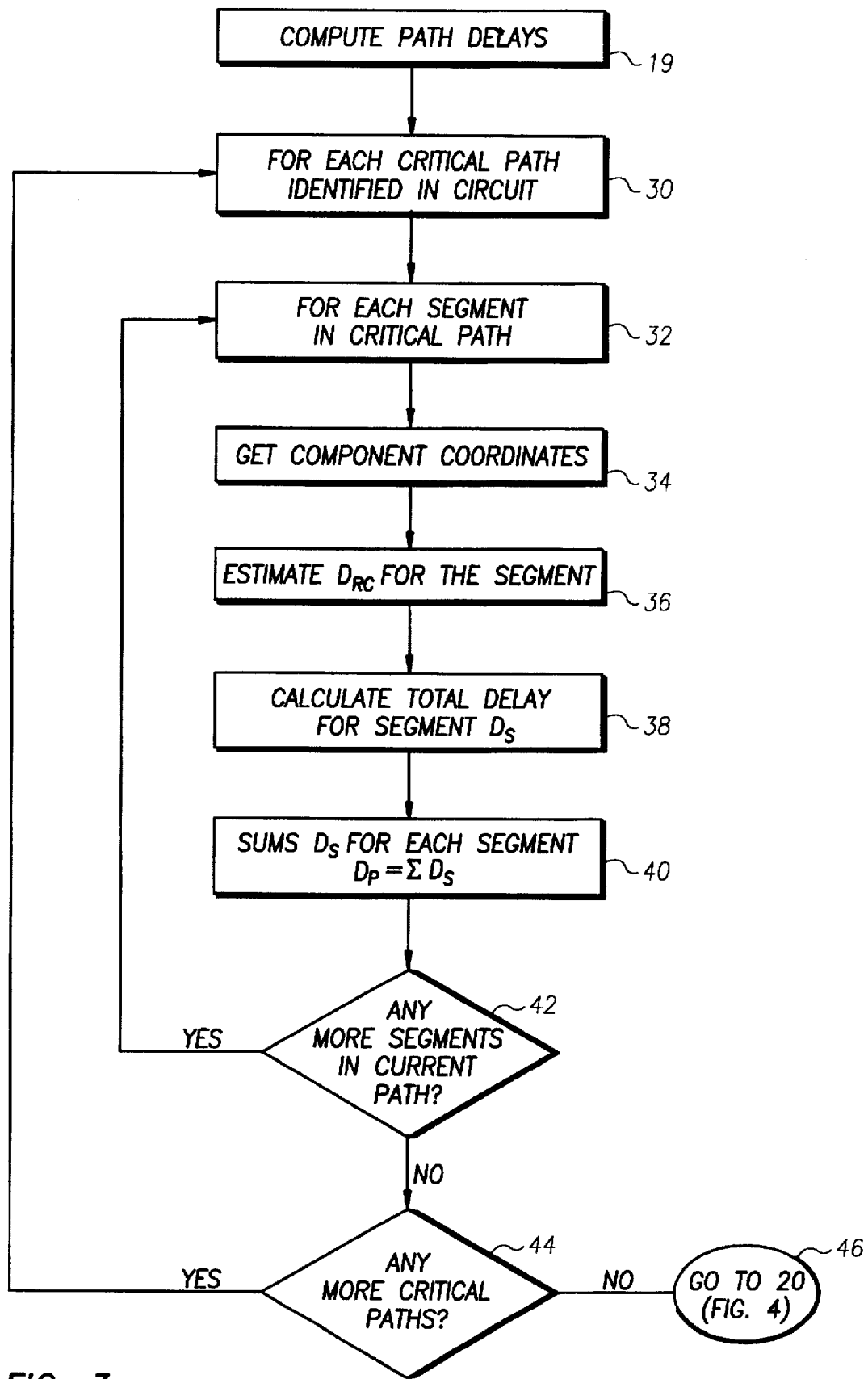
FIG. 3 illustrates the procedural flow of the routine of the present invention for computing path delays of critical paths.

FIG. 3 illustrates a more detailed sequence of steps for the compute path delay step 19 of FIG. 2. Functional step 30 selects a particular critical path previously identified, and then step 32 selects in turn each segment of the critical path and performs the steps associated with determining the interconnect delays for each of those segments of the selected critical path. The process begins with step 34, which obtains the coordinates defining the current placement of the component or module which is included in the current segment of the current critical path. The coordinates are then used to estimate $D_{RC}$ for that segment by performing the calculations described above. The coordinates are also used to estimate the overall wire length of the net coupled to the current segment for purposes of estimating $C_W$ so that the delay in driving the net capacitance can also be calculated. Functional step 36 represents the calculation of these results. The total delay for the current segment $D_S$ is then calculated by adding the interconnect delays calculated by functional step 36 to the intrinsic delays associated with the design parameters of the component within the current segment.

Functional step 40 represents the summing of the segment delays for each segment of the current critical path to determine total critical path delay $D_P$ for the current critical path. Once the path delays for all of the identified critical paths have been calculated the process goes to step 20 of FIG. 2 which generates and assigns weight values to all of the nets of the circuit.

Figure 4A:
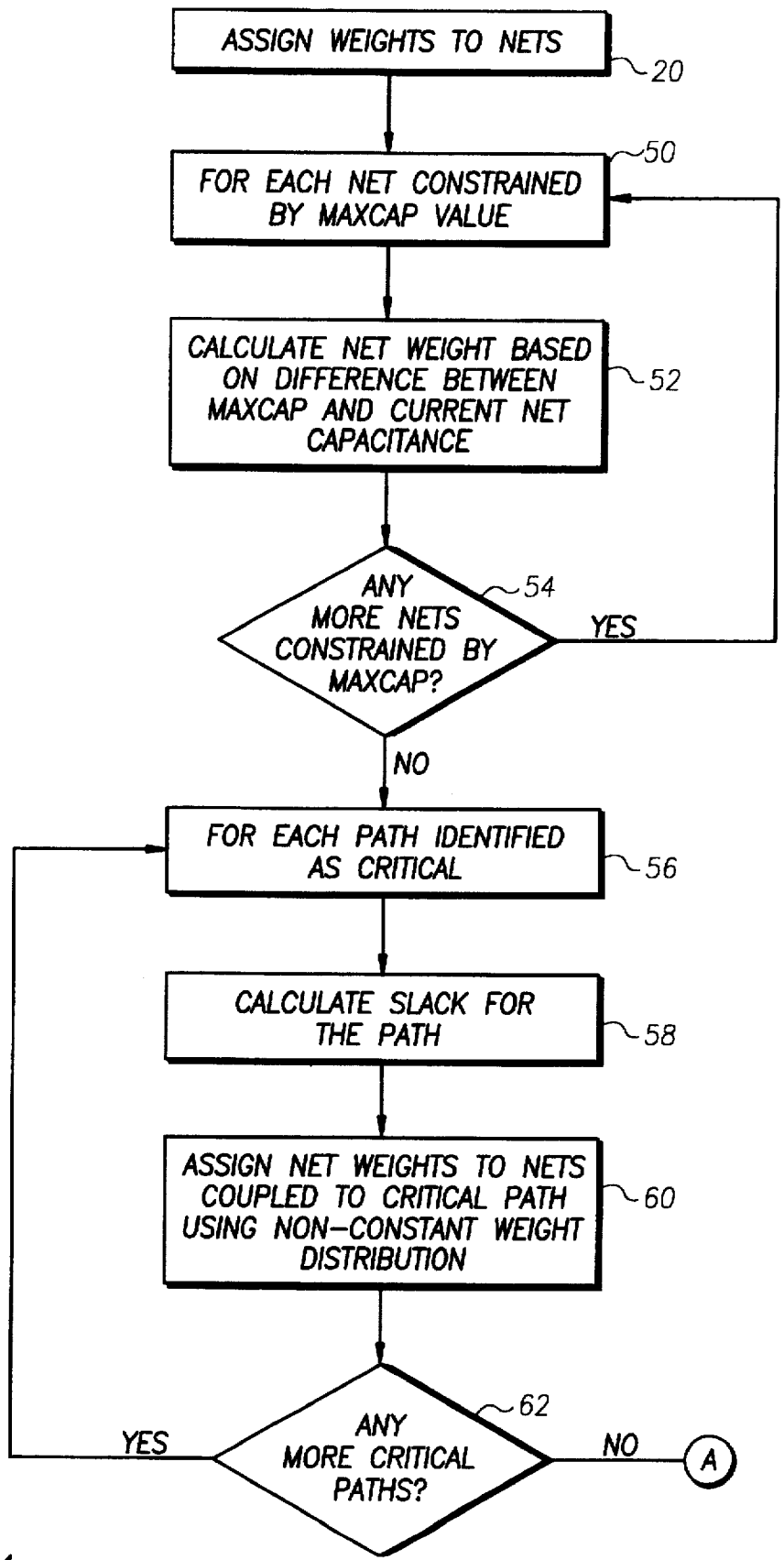
FIG. 4 illustrates the procedural flow of the routine of the present invention for assigning weights to nets.
Figure 4B:
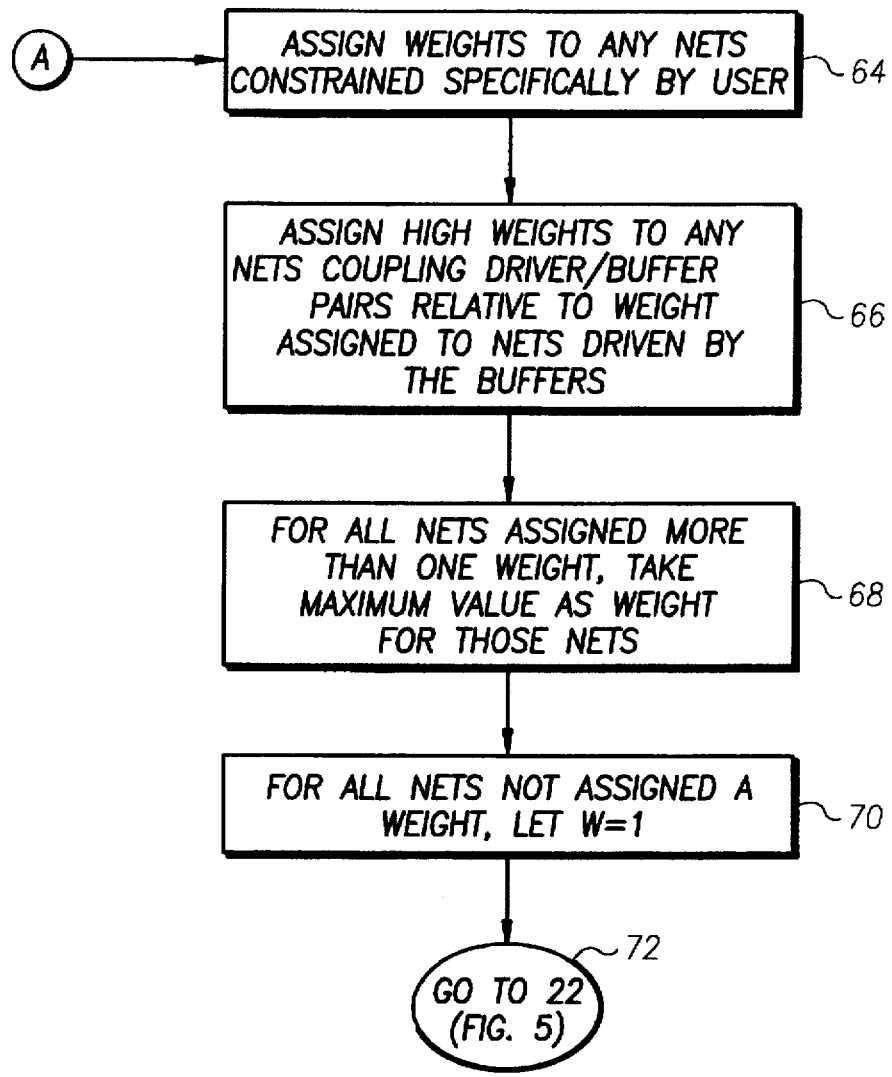

FIG. 4 illustrates a detailed flow diagram of the process by which net weight values are assigned to each of the nets of the circuit. First, each net that has been initially constrained by a MAXCAP value is assigned a weight which is inversely proportional to the difference between the net's MAXCAP value and an estimated total net capacitance. The total net capacitance is based on an estimate of the total wire length of the net based on the current placement of components coupled to that net. The function which determines the weight to be assigned can be linear or can be made non linear such that the weights do not become high until the total estimated capacitance for the current net exceeds some fraction of the MAXCAP value which is greater than one-half. Steps 50, 52 and 54 represent this process in FIG. 4.

The process then proceeds to step 56, which selects each critical path and first calculates the slack for the current critical path and then generates net weights to be assigned to each of the nets coupled to the current critical path wherein the assigned weight values are distributed in a non-constant manner. Functional block 58 represents the step of calculating the slack for the current critical path. The slack is calculated as follows:

For a given path, SLACK=$D_C-D_I$, where $D_I$ is equal to the sum of all delay constituents for each segment of the path (i.e. $D_i+S \cdot C_{in}$) intrinsic to the component of the segment. Put another way, $D_I$ is the sum of the delay constituents which are fixed by the component designs.

Once the slack has been calculated for the critical paths, term-weights $W_T$ are calculated by the constraint engine for each critical path as follows: If $D_L$>SLACK/2, where $D_L$ is equal to the sum of all delay constituents for each segment of the path (i.e. $S \cdot C_W+D_{RC}$) due to interconnect, the preferred embodiment of the method of the invention assumes that the path constraint has been violated. In this case, the term weight $W_T$=(max[$D_L$−SLACK/2; 5])·(max[10−$i_L$; 1]). If $D_L \leq$ SLACK/2, then $W_T$=1. Thus, if the delay along the path due to interconnect $D_L$ exceeds half of the slack, $W_T$ is determined by multiplying the maximum of two values, either the amount by which $D_L$ exceeds one half of the slack or 5, by the maximum of two other numbers, either the difference between 10 and the mincut iteration level ($i_L$, or 1.

The value of $W_T$ for each path is directly proportional to the amount by which $D_L$ exceeds one half of the slack, and the iteration level $i_L$ of the mincut minimization algorithm. For those critical paths having slack which equals or exceeds two times the initial interconnect delay (i.e. SLACK≧2($D_L$), the weight W assigned to each net coupled into the segments of that path is set equal to 1.

Figure 7A:
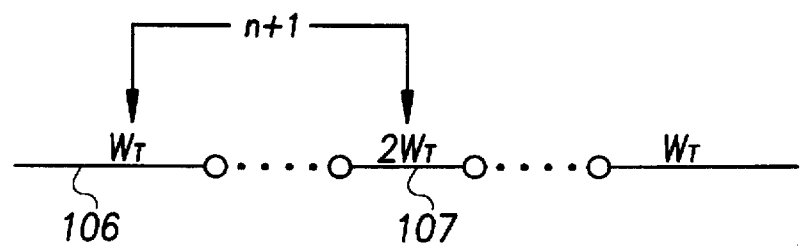
FIG. 7a illustrates one preferred embodiment of the non-constant weighting scheme of the present invention.
Figure 7B:
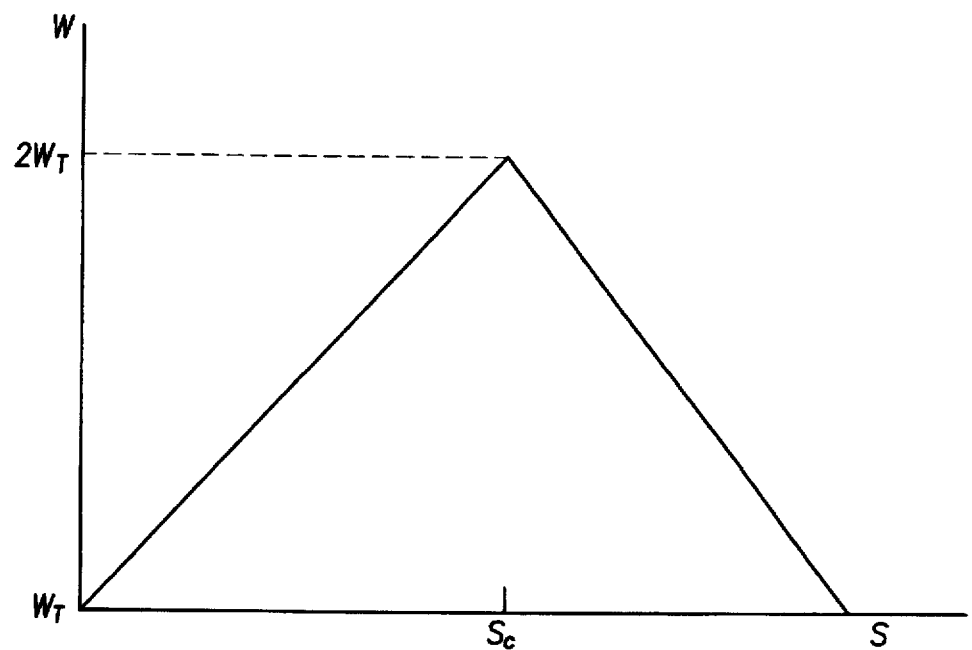
Figure 7C:
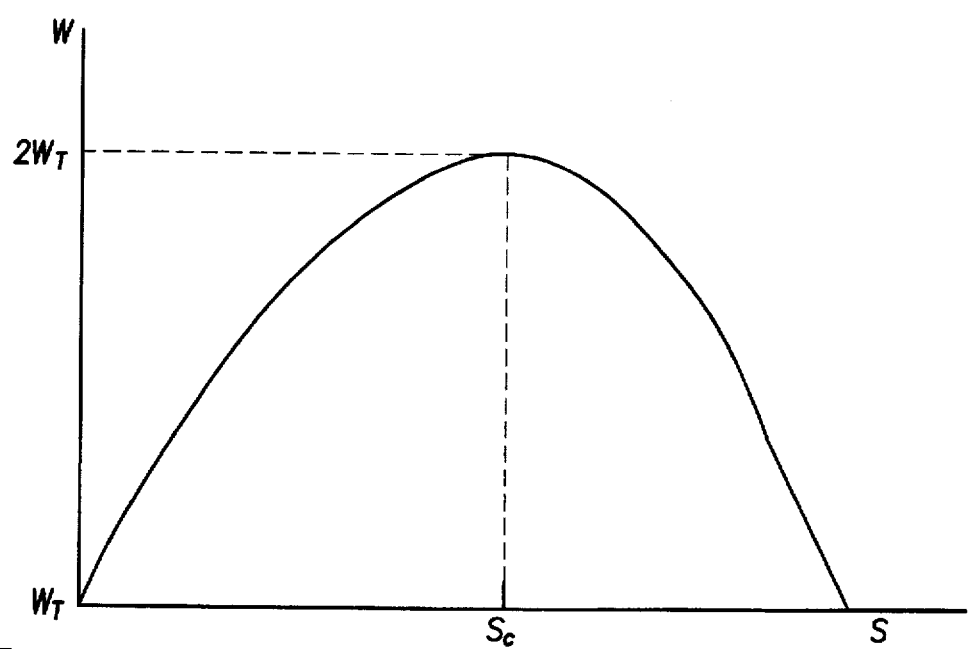
FIG. 7c illustrates the distribution of non-constant net weight values for a second preferred embodiment of the non-constant net weighting scheme of the present invention which is convex.

The term weight $W_T$ calculated for the current critical path is the basis upon which net weights are generated and assigned to all of the nets coupled to segments of the current critical path. FIG. 7A illustrates a generic distribution of the net weights to a critical path having a center-most segment 107 and to outer-most end segments 106. In a preferred embodiment of the invention, the net coupled to center-most segment 107 is assigned a net weight which is equal to twice the term weight $W_T$ calculated for that critical path. The nets coupled to the end segments 106 are assigned a net weight which is equal to the term weight. Those skilled in the art will recognize that there are any number of non-constant distribution profiles by which the assignment of weights to nets coupled to both segments between segment 107 and 106 can be accomplished, including a linear distribution and a convex distribution. FIG. 7b illustrates a linear distribution and FIG. 7c illustrates a convex distribution, each distribution having a maximum weight value assigned to the net coupled to the center-most segment $S_C$, with the weight values assigned to the nets of those segments moving toward the ends of the critical path falling off in some manner to the term weight $W_T$. Those skilled in the art will also recognize that the most important aspect of the net weight distribution is the skewing of weight values to the nets coupled to segments in the center of the critical path relative to the nets coupled to segments at the ends of the critical path.

Once steps 58 and 60 have been performed for each of the critical paths of the circuit, the process then moves on to assign weight values to any nets which have been specified as initial constraints by the user. This step is represented by functional block 64 of FIG. 4. Functional block 66 then represents the step of assigning relatively high weights to any nets coupling drivers to buffers and relatively low net weights to the nets driven by the buffers. These driver/buffer pairs had already been previously identified in step 16 of FIG. 2. Such driver/buffer pairs can be recorded in a table. The process then takes the maximum of all weight values to be the assigned weight for all those nets having more than one weight value currently assigned to them. Finally, for any nets not currently having been assigned a net weight, the method of the invention assigns those nets a default weight value of 1.

Figure 5:
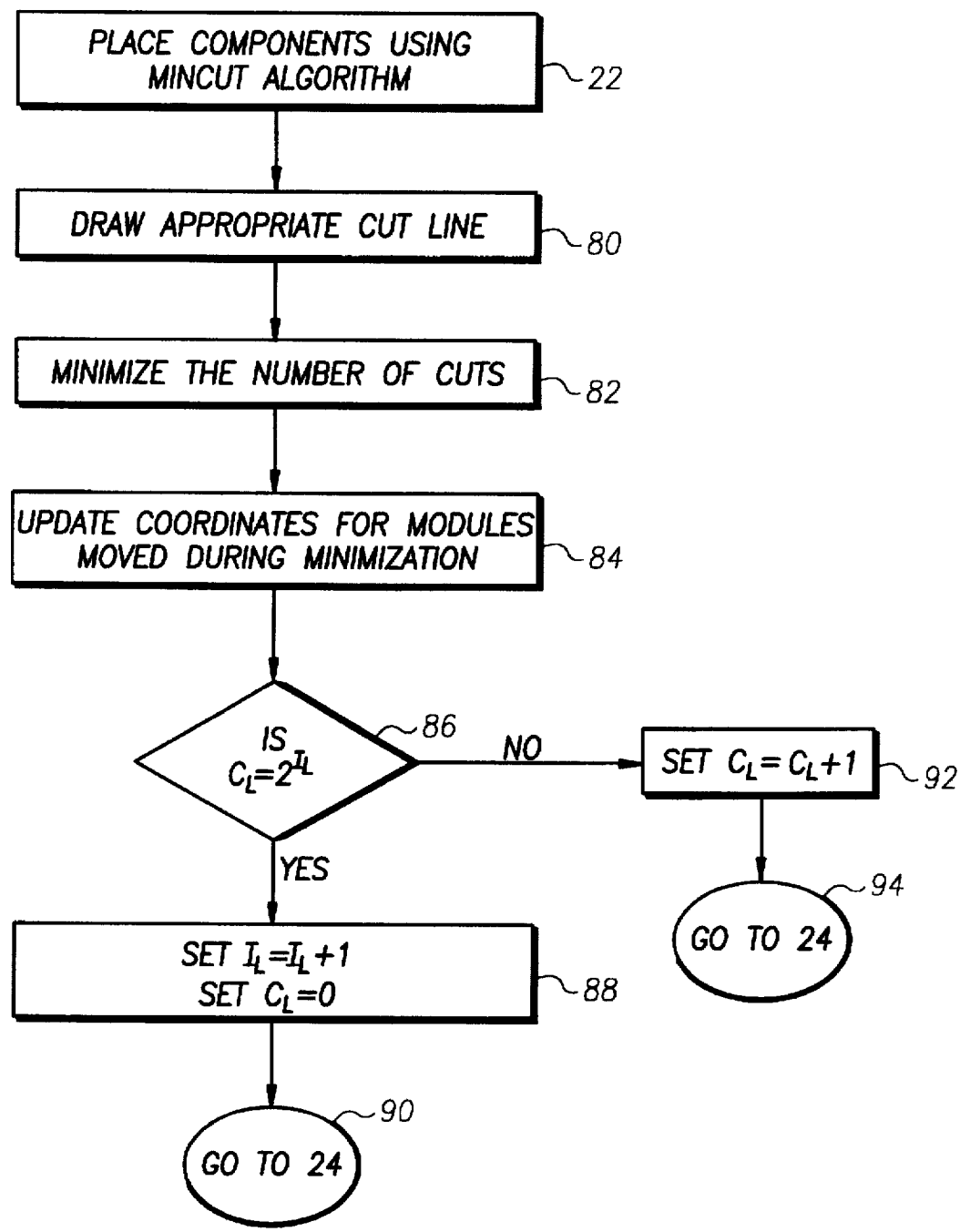
FIG. 5 illustrates the procedural flow of the routine of the present invention for placing components using the mincut algorithm.
Figure 6:
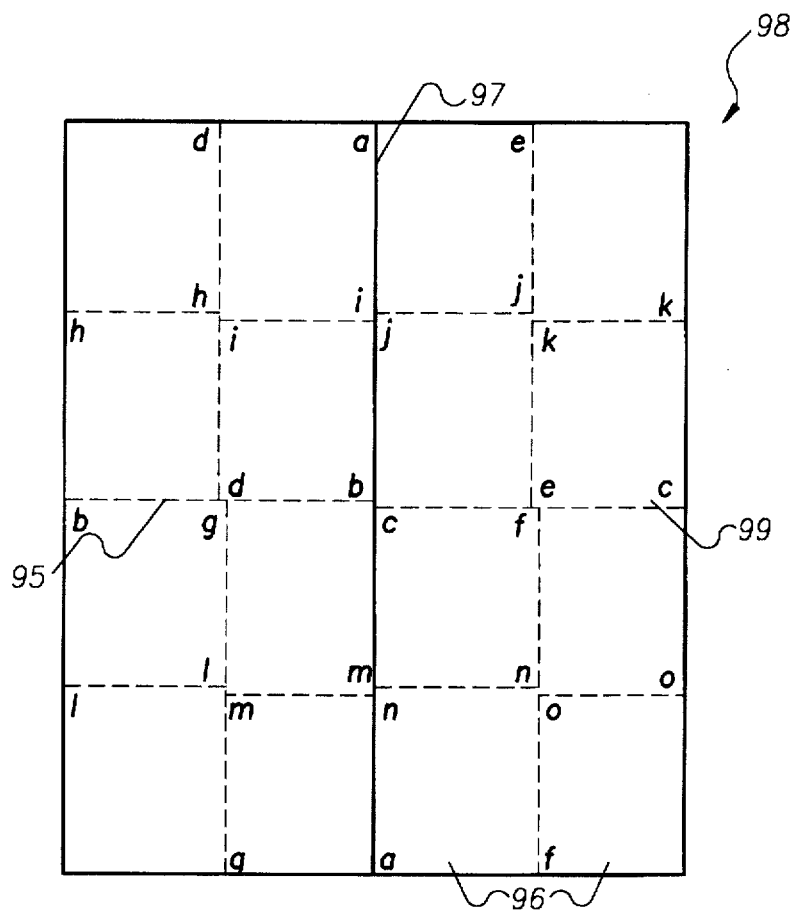
FIG. 6 illustrates a circuit area which has been divided up into regions using the mincut algorithm of the present invention.

The process than proceeds to step 22 of FIG. 5, during which the components are placed in view of the new net weight assignments generated by step 20. FIG. 5 illustrates a more detailed flow-diagram for the placement process. Placement step 22 calls the mincut algorithm which first draws an appropriate cut line depending upon the current iteration level of the process. FIG. 6 illustrates an example of an integrated circuit 98 which has been cut into nearly equal portions 96 by various cutlines 97, 95 and 99. When the iteration level is at zero (i.e. $i_L$=0), the first cutline drawn will be for example, cutline a 97. The mincut algorithm then attempts to minimize the total weight of all nets intersected by cutline a 97 while maintaining die area to be roughly equal within some tolerance. Once the mincut algorithm converges on a minimized weight, the coordinates for the various components are updated in accordance with the new optimized placement. The method then determines whether all of the appropriate cutlines have been drawn for the current iteration level and if the answer is "no," the cutline is incremented by 1 and the method returns to step 24 of FIG. 2. If all the appropriate cutlines have been drawn for a particular iteration, the iteration level is incremented and the cutline is set equal to zero (0) before returning to step 24 of FIG. 2.

If all of the approximately equal-sized regions defined by the cutlines drawn by the mincut algorithm contain just one element, the placement process is complete and the method of the invention returns to step 8 of FIG. 1 for global and detailed routing. If the regions do not contain just one element the method returns to block 19 of FIG. 2 whereby the steps of computing path delays 19, assignment net weights to nets 20, placing components using the mincut algorithm 22 are again repeated.

Returning to FIG. 6, it can be seen that the next cutlines to be drawn will be cutline b 95 and then cutline c 99. For the next iteration level, cutlines d, e, f and g will be drawn sequentially (but not necessarily in that order) each time through step 22. For the next level of iteration, cutlines h, i, j, k, l, m, n and o will be drawn sequentially (but not necessarily in that order) each time through step 22. As previously discussed, this process preferably continues until each area 96 contains only 1 component or module. Of course, the number of iterations through the placement process can be halted prior to this point if the placement is deemed satisfactory.

Figure 8:
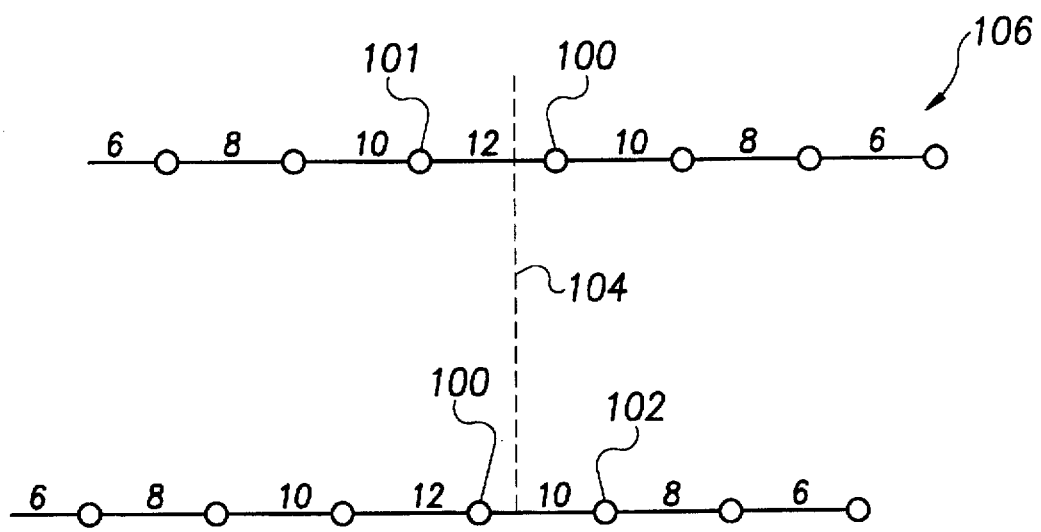
FIG. 8 illustrates the benefit of the non-constant net weighting scheme of the present invention.

FIG. 8 illustrates the benefit of using a non-constant weight distribution for nets coupled to segments of a critical path. For critical path 106, it is encouraged during step 22, to move component 100 to the left side of cutline 104 because the total weight of all nets cut by the cutline 104 has been decreased by 2. Of course it is also encouraged for component 101 to be moved to the right side of cutline 104 for the same reasons. It will also be realized that once such a move has been made, the mincut algorithm will be discouraged from moving component 100 back across the cutline. Moreover, there is now an incentive for the mincut algorithm to move component 102 to the left of cutline 104 to further reduce the weight by 2. Thus, the non-constant weight distribution encourages the critical paths themselves to be shortened, thereby reducing $D_{RC}$ as well as $C_W$ for each of the nets coupled to the critical path.

What is claimed is:

1. A method for optimizing the placement of components of an integrated circuit, the components interconnected by nets to form paths wherein each of the nets couples an output of one of the components to one or more inputs of one or more of the components, and wherein each of the paths comprises one or more segments, each of the segments of one of the paths comprising one of the components and the net coupled to the output of the component, each of the segments of one of the paths coupled by a branch of its net to an input of one of the components comprising a next segment in the path, said method comprising the steps of:

identifying one or more of the paths as critical;

imposing a maximum delay constraint on each of the critical paths;

performing an initial placement of the components which becomes the current placement;

for each of the critical paths:

estimating a path delay for the critical path based on the current placement; and assigning weight values to each of the nets which form part of the segments of the critical path, said assigned weight values having a non-constant distribution based on location of the segment in the critical path of which each net is a part;

assigning a default weight value to each of the nets not previously assigned a weight;

applying a mincut algorithm to find a placement of the components that minimizes total weight of the nets crossing a cut line, the weight minimized placement becoming the current placement; and iterating said method from said step of estimating path delays through said step of applying a mincut algorithm until the components are optimally placed.

2. The method of claim 1 wherein the non-constant distribution of weight values assigned to the nets forming part of the segments of one of the critical paths decreases continuously from a peak value assigned to the net of the center-most segment of the critical path to a minimum value assigned to the nets of the two outer-most segments of the critical path.

3. The method of claim 2 wherein the distribution of the assigned weight values decreases linearly from the peak value to the minimum value.

4. The method of claim 2 wherein the distribution of the assigned weight values is convex in nature.

5. The method of claim 1, wherein at least one of said iterations of said method further comprises the steps of:
constraining one or more of the nets with a maximum capacitance value; and
for each of the nets constrained by a maximum capacitance value:
estimating total capacitance of the net based on the current placement; and
assigning a weight value to the net that is inversely proportional to the difference between the maximum capacitance value and the estimated total capacitance.

6. The method of claim 5 wherein any of the nets having multiple assigned weight values is deemed to be assigned the maximum of the multiple assigned weight values.

7. The method of claim 1 or 5 wherein said step of estimating a path delay further comprises the steps of:
determining delay ($D_S$) for each of the segments of the critical path in accordance with $D_S=D_i+S \cdot C_{in}+S \cdot C_W+D_{RC}$ wherein $D_i$ is intrinsic delay through the component of the segment, S is effective resistance of the component of the segment, $C_{in}$ is summation of all input capacitance coupled to the net of the segment, $C_W$ is total capacitance presented to the output of the component of the segment by the net of the segment, and $D_{RC}$ is propagation delay along the branch of the net of the segment which couples the component of the segment to the component of the next segment of the path; and
summing the delays $D_S$ for all of the segments of the path.

8. The method of claim 7 wherein the step of assigning weight values to each of the nets which are part of the segments of the critical path further comprises the step of computing the slack for the critical path in accordance with SLACK=$D_C-D_I$, wherein $D_C$ is the maximum delay constraint imposed on the critical path and $D_I$ is a summation of $D_i+S \cdot C_{in}$ for each of the segments of the path.

9. The method of claim 8 wherein the step of assigning weight values to each of the nets which are part of the segments of the critical path further comprises the step of calculating a term weight ($W_T$), said step of calculating a term weight further comprising the steps of:
setting $W_T$=(max [$D_L$−SLACK/2; 5])·(max [10−$i_L$; 1]) when $D_L$>SLACK/2, wherein $D_L$ is a summation of $S \cdot C_W+D_{RC}$ for each of the segments of the critical path and $i_L$ is a current iteration level of the mincut algorithm; and
setting $W_T$=1 when $D_L \leq$ SLACK/2.

10. The method of claim 9 wherein the weight value assigned to the net of the centermost segment of each critical path is $2W_T$, and the weight values assigned to the nets of the centermost segments of each critical path is $W_T$.

11. The method of claim 7 wherein said step of estimating a path delay further comprises the step of estimating total wire length of the net of each segment based on the current placement.

12. The method of claim 11 wherein said step of estimating total wire length is performed using an approximate Steiner Tree.

13. The method of claim 7 wherein the step of estimating a path delay further comprises the step of estimating $D_{RC}$ for each segment of the critical path in accordance with $D_{RC}=$ r·D (L/(D+L)) ($C_W+C_{in}$), wherein r is unit length resistance of the branch coupling the segment with the next segment of the critical path, D is the length of the branch, L is the total length of the net of the segment, $C_W$ is total capacitance of the net of the segment and $C_{in}$ is total input capacitance coupled to the net of the segment.

14. The method of claim 13 wherein D is estimated as a rectilinear distance between a coordinate position of the output pin of the component of the segment and a coordinate position of the input pin of the component of the next segment.

15. The method of claim 14 wherein L is estimated using a bounding box which encompasses coordinate positions of input pins of all components coupled to the net of the segment and the coordinate position of the output pin of the component of the segment, L being estimated as a sum of the width and the height dimensions of the bounding box.

16. The method of claim 1 or 5 wherein the default weight value is one.

17. The method of claim 1 or 5, wherein at least one of said iterations of said method further comprises the steps of:
identifying driver/buffer pairs; and
for each driver/buffer pair, assigning a weight value to a net coupling an output of the driver to an input of the buffer and a weight value to a net coupled to an output of the buffer, wherein the weight value assigned to the net driven by the driver is relatively much greater than the weight value assigned to the net driven by the buffer.

18. The method of claim 1 wherein the initial placement is performed using a mincut algorithm.

19. The method of claim 1 wherein the initial placement is performed to optimize initial placement of components while optimizing total overall length of all of the nets.

20. The method of claim 1, wherein said non-constantly assigned weight values are highest at one end of said critical path, and continuously decrease to a minimum weight value at the opposite end of said critical path.

21. The method of claim 1, wherein said non-constantly assigned weight values are highest in the center segment or segments of said critical path, and are relatively lower towards each end of said critical path.

22. A method for optimizing the placement of components of an integrated circuit comprising the steps of:
identifying at least one path of segments including components coupled by nets on said integrated circuit as critical;
assigning weight values to the nets which form part of the segments of said critical path, wherein:
said weight values are non-constant;
said weight values are assigned based in part upon the location of the segment in the critical path of which each net is a part; and
applying a mincut method to find a placement of said components that minimizes the total weight of the nets that cross cut lines.

* * * * *